(12) United States Patent
Farooq et al.

(10) Patent No.: US 9,461,017 B1
(45) Date of Patent: Oct. 4, 2016

(54) ELECTRONIC PACKAGE THAT INCLUDES A PLURALITY OF INTEGRATED CIRCUIT DEVICES BONDED IN A THREE-DIMENSIONAL STACK ARRANGEMENT

(71) Applicant: GLOBALFOUNDRIES Inc., Grand Cayman (KY)

(72) Inventors: Mukta G. Farooq, Hopewell Junction, NY (US); John A. Fitzsimmons, Poughkeepsie, NY (US); Andrew H. Simon, Fishkill, NY (US); Anthony K. Stamper, Williston, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/685,061

(22) Filed: Apr. 13, 2015

(51) Int. Cl.
  H01L 23/52 (2006.01)
  H01L 29/40 (2006.01)
  H01L 25/065 (2006.01)
  H01L 23/66 (2006.01)
  H01L 23/00 (2006.01)
  H01L 25/00 (2006.01)

(52) U.S. Cl.
  CPC .......... *H01L 25/0657* (2013.01); *H01L 23/66* (2013.01); *H01L 24/17* (2013.01); *H01L 24/32* (2013.01); *H01L 24/81* (2013.01); *H01L 24/83* (2013.01); *H01L 25/50* (2013.01); *H01L 2223/6677* (2013.01); *H01L 2224/13147* (2013.01); *H01L 2224/16145* (2013.01); *H01L 2224/32145* (2013.01); *H01L 2224/8112* (2013.01); *H01L 2224/8312* (2013.01); *H01L 2225/06513* (2013.01); *H01L 2225/06541* (2013.01); *H01L 2924/14* (2013.01)

(58) Field of Classification Search
  CPC .............. H01L 21/768; H01L 2225/06541; H01L 25/18; H01L 23/528; H01L 23/481; H01L 23/5286; H01L 23/5223; H01L 23/49827; H01L 2224/16227; H01L 2224/16225; H01L 23/66; H01L 24/17; H01L 24/32; H01L 24/83; H01L 25/0657; H01L 2225/06513; H01L 2223/6677; H01L 2224/16145; H01L 2224/32145; H01L 24/81
  See application file for complete search history.

(56) References Cited

U.S. PATENT DOCUMENTS

| | | | |
|---|---|---|---|
| 6,373,447 B1 | 4/2002 | Rostoker et al. | |
| 6,563,464 B2 | 5/2003 | Ballantine et al. | |
| 6,646,328 B2 | 11/2003 | Tsai | |
| 7,417,515 B2 | 8/2008 | Chominski | |
| 7,911,014 B2 | 3/2011 | Doan | |
| 8,201,746 B2 | 6/2012 | Guo et al. | |
| 2008/0197491 A1* | 8/2008 | Matsui | H01L 23/60 257/737 |
| 2010/0155931 A1* | 6/2010 | Ray | H01L 23/481 257/698 |
| 2016/0049360 A1* | 2/2016 | Bernstein | H01L 23/46 257/692 |

* cited by examiner

*Primary Examiner* — Jasmine Clark

(74) *Attorney, Agent, or Firm* — Robert Curcio; DeLio, Peterson & Curcio, LLC

(57) ABSTRACT

An electronic package comprising a plurality of vertically stacked integrated circuit (IC) devices including a first IC device and a second IC device is provided. The electronic package also includes a first bonding layer coupling one side of the first IC device entirely to a portion of a side of the second IC device. The remaining portion of the side of the second IC device that is not coupled to the one side of the first IC device, includes an antenna.

18 Claims, 6 Drawing Sheets

Electronic Package 200

ELECTRONIC PACKAGE THAT INCLUDES A PLURALITY OF INTEGRATED CIRCUIT DEVICES BONDED IN A THREE-DIMENSIONAL STACK ARRANGEMENT

BACKGROUND

The present disclosure is generally related to data processing, or, more specifically, electronic packages and methods of creating an electronic package that includes a plurality of integrated circuit devices bonded in a three-dimensional stack arrangement.

DESCRIPTION OF RELATED ART

To accommodate more integrated circuit (IC) devices within a two dimensional area, separate IC devices are integrated and stacked with other components into a single three-dimensional (3D) electronic package. In 3D electronic packages, IC devices within a stack may be interconnected in a number of ways. For example, bond pads formed at the surface of each IC device may be wire bonded, either to a common substrate or to other IC devices in the stack. Another example is a so-called "micro-bump" 3D package, where each IC device includes a number of micro-bumps that are routed to a circuit board, e.g., along an outer edge of the IC device.

Still another way of interconnecting IC devices within the stack is to use through-substrate vias (TSVs). TSVs extend through a substrate, thereby electrically interconnecting circuits on various IC devices. Such through-substrate via interconnections can provide advantages in terms of interconnect density as compared to other technologies. In addition to applications in 3D IC device stacking, through-substrate via interconnections may also be used to increase performance of antenna communication devices by providing very low resistive ground contacts to a wafer backside, as well as advanced heat sink capability.

Although antenna communication devices may benefit from IC stacking technology, the typical requirement that radiating and receiving antenna structures be placed on the front side or back side of an IC device has proven to be quite a challenge with respect to the packaging of the other IC devices within the stack.

SUMMARY

An electronic package comprising a plurality of vertically stacked integrated circuit (IC) devices including a first IC device and a second IC device is provided. The electronic package also includes a first bonding layer coupling one side of the first IC device entirely to a portion of a side of the second IC device. The remaining portion of the side of the second IC device that is not coupled to the one side of the first IC device, includes an antenna.

By coupling only a portion of a side of the second IC device to the entire side of the first IC device, a gap between the first IC device and the second IC device is created for placement of the antenna of the second IC device. Creating a gap for the antenna thus allows the second IC device with the antenna to be closely coupled to the first IC device in the stack, which provides the above discussed density advantages of 3D packaging.

The foregoing and other objects, features and advantages described herein will be apparent from the following more particular descriptions of example embodiments as illustrated in the accompanying drawings wherein like reference numbers generally represent like parts of example embodiments.

DETAILED DESCRIPTION OF EXAMPLE EMBODIMENTS

Figure 1A:
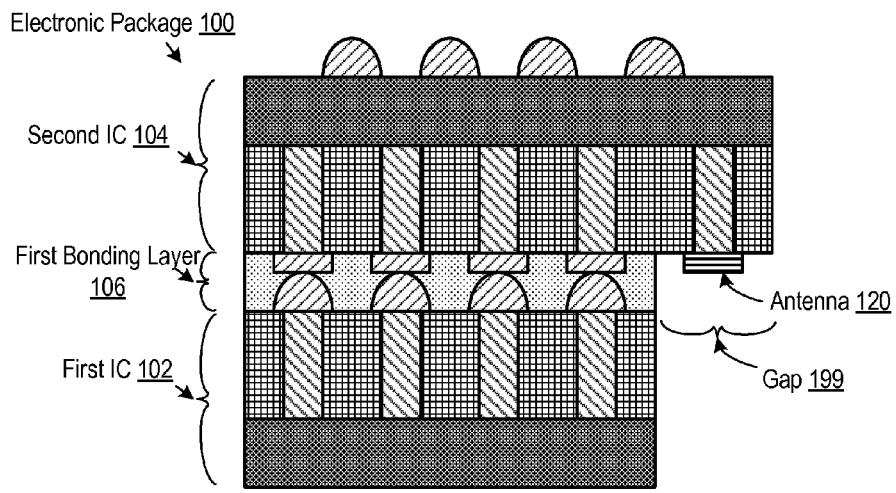
FIG. 1A sets forth a diagram illustrating a cross sectional view of various levels of an example electronic package that includes a plurality of integrated circuit (IC) devices bonded in a three-dimensional (3D) stack arrangement according to embodiments described herein.

For further explanation, FIG. 1A sets forth a diagram illustrating a cross sectional view of various levels of an example electronic package (100) that includes a plurality of integrated circuit (IC) devices bonded in a three-dimensional (3D) stack arrangement according to embodiments described herein. In the example of FIG. 1A, the electronic package (100) includes a first IC device (102) and a second IC device (104).

Figure 1B:
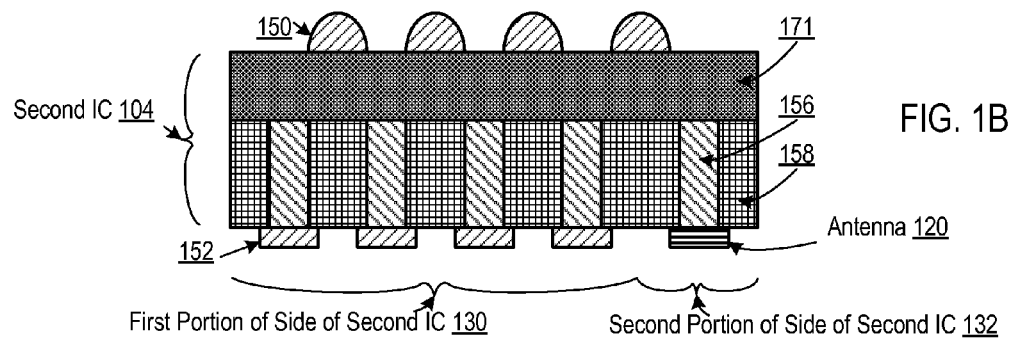
FIG. 1B sets forth a diagram illustrating a cross sectional view of various levels of the second IC device of FIG. 1A, which may be bonded to one or more additional IC devices in a 3D stack arrangement according to embodiments described herein.
Figure 1C:
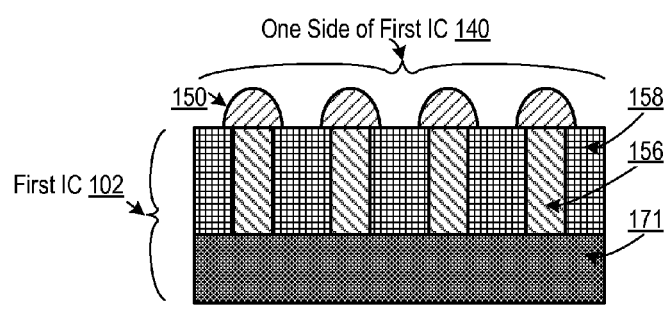
FIG. 1C sets forth a diagram illustrating a cross sectional view of various levels of the first IC device of FIG. 1A, which may be bonded to one or more additional devices in a 3D stack arrangement according to embodiments described herein.

For further explanation, FIG. 1B sets forth a diagram illustrating a cross sectional view of various levels of the second IC device (104) of FIG. 1A and FIG. 1C sets forth a diagram illustrating a cross sectional view of various levels of the first IC device (102) of FIG. 1A.

The first IC device (102) and the second IC devices (104) of FIGS. 1A-C may be formed or manufactured using well-known processing steps commonly practiced in semiconductor device fabrication. Exemplary process steps and materials are exemplified below; however, it is to be understood that alternative steps within the skill of one skilled in the art may be substituted in place of such examples.

In general, semiconductor device fabrication is the process used to create the integrated circuits that are present in everyday electrical and electronic devices. Typically semiconductor device fabrication includes a multiple-step sequence of photo lithographic and chemical processing steps during which electronic circuits are sequentially created on a wafer made of materials such as semiconductors and insulators. Silicon or GaAs are almost always used for wafers incorporating active devices, such as transistors, but various compound semiconductors or insulators such as silica glass or sapphire with semiconductors deposited on them are also used for specialized applications. In a particular embodiment, a silicon wafer may be used. A typical silicon wafer is made out of extremely pure silicon that is grown into mono-crystalline cylindrical ingots (boules) currently up to 450 mm (slightly less than 18 inches) in diameter using the Czochralski or float zone processes. These ingots are then sliced into wafers about 0.75 mm thick and polished to obtain a very regular and flat surface.

In typical semiconductor device fabrication, the various processing steps fall into four general categories: deposition, removal, patterning, and modification of electrical properties. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal is any process that removes material from the wafer; examples include etch processes (either wet or dry) and chemical-mechanical planarization (CMP). Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing. Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators via exposure to ultra-violet light in UV processing (UVP).

Typically, the front-end-of-line (FEOL) is the first portion of IC fabrication where the individual devices (transistors, capacitors, resistors, etc.) are patterned in the semiconductor. FEOL is generally considered to cover everything up to (but not including) the deposition of metal interconnect layers. For example, a typical FEOL may contain all processes of CMOS fabrication needed to form fully isolated CMOS elements: selecting the type of wafer to be used; chemical-mechanical planarization and cleaning of the wafer; shallow trench isolation (STI); well formation; gate module formation; and source and drain module formation.

Once the various semiconductor devices have been created, the devices must be interconnected to form the desired electrical circuits. This occurs in a series of wafer processing steps collectively referred to as back end of line (BEOL). BEOL processing involves creating metal interconnecting wires that are isolated by dielectric layers. The BEOL is the second portion of IC fabrication where the individual devices (transistors, capacitors, resistors, etc.) get interconnected with wiring on the wafer. BEOL generally begins when the first layer of metal is deposited on the wafer. BEOL includes contacts, insulating layers (dielectrics), metal levels, and bonding sites for IC device-to-package connections. In typical systems, BEOL may include some or all of the following steps: silicidation of source and drain regions and the polysilicon region; adding a dielectric (first, lower layer is Pre-Metal dielectric, PMD—to isolate metal from silicon and polysilicon); CMP processing; making holes in PMD; add a metal layer; adding a second dielectric; making vias through dielectric to connect lower metal with higher metal; filling vias by Metal CVD process; repeating steps for all metal layers; and adding final passivation layer to protect the IC device.

For example, each of the IC devices (102, 104) of FIGS. 1A-C may have a front end of line (FEOL) region where active devices (e.g., transistors) are formed in a semiconductor substrate (e.g., a bulk substrate or a semiconductor-on-insulator substrate). That is, each of the IC devices may include one or more semiconductor devices. The FEOL region of the IC devices (102, 104) of FIGS. 1A-C include TSVs (156) and a surrounding substrate and/or barrier layers (generally depicted at 158) in FIGS. 1A-C. The TSV's (156) typically are insulated from the substrate (158) although TSV's (156) grounded to the substrate (158) may be used, for example, when the substrate (158) is sufficiently insulating to the rf frequency of interest. Electrical connections to the active devices in the substrate are made through several wiring levels formed on a back end of line (BEOL) region (171), which generally includes successively larger layers of copper wiring lines connected to other lines by vertical vias. In a particular embodiment, during the fabrication process, after the BEOL build is complete, the TSVs are revealed followed by grindside wiring pad or redistribution level. Before or after TSV reveal, the IC device is passivated and configured for an eternal connection thereto. In the examples of FIGS. 1A-C, the first IC device and the second IC device are configured for external connection to another IC device by a metal landing pad (152) to a solder connection (150), such as controlled collapse IC device connects (C4) bonding. Other types of connections may be used, such as Cu pillars or planar Cu. TSV's can be formed from the wafer frontside, before wafer thinning, or from the backside, after wafer thinning.

In the examples of FIGS. 1A-C, the second IC device (104) also includes an antenna (120) for communication with other IC devices, such as through radio frequency (RF). According to various embodiments, the antenna may be formed using components fabricated in the back end of line (BEOL) portion of the IC device formation or using an insulated through substrate via (TSV). In particular embodiments, the antenna may be formed of a metal wire, a C4 bonding, or a copper pillar. Depending on the requirements of the IC device, which is utilizing the antenna, the antenna may need to either be on the face or the back of the IC device. In the examples of FIGS. 1A-1C, the antenna is on the underside of the device, chip, or wafer. Readers of skill in the art will realize that the antenna could be placed on either the underside or the topside of the device, chip, or wafer, as will be explained in further detail below.

Figure 2:
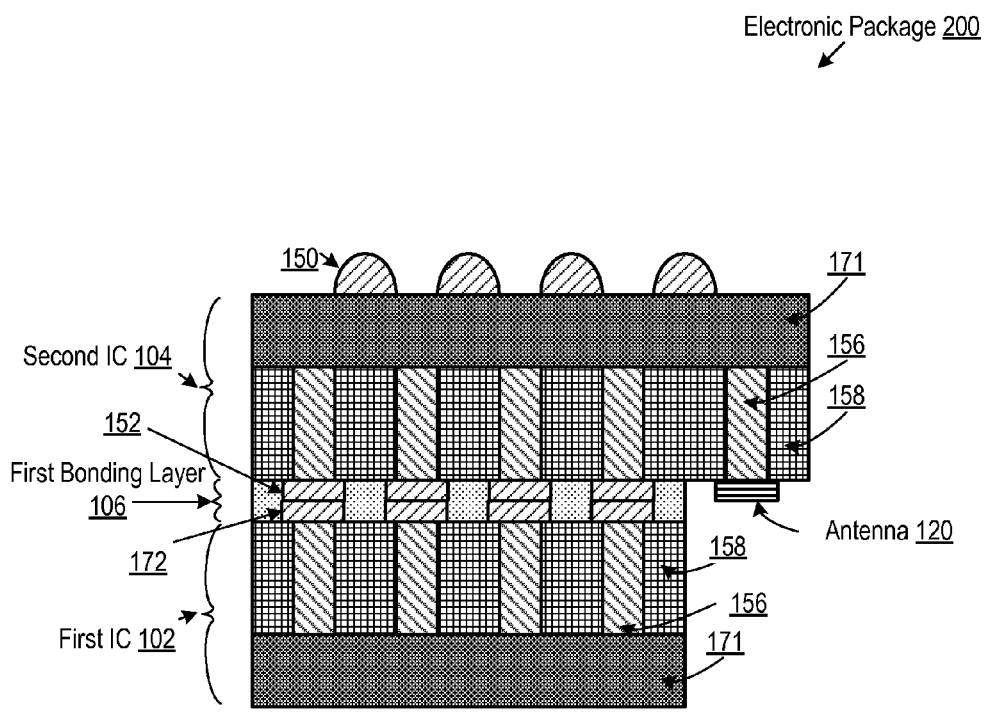
FIG. 2 sets forth a diagram illustrating a cross sectional view of various levels of another example electronic package that includes a plurality of IC devices bonded in a 3D stack arrangement according to embodiments described herein.

After forming the IC devices, as part of assembling a 3D electronic package, the IC devices may be combined together. In the examples of FIGS. 1A-C, the first IC device (102) and the second IC device (104) are coupled by a first bonding layer (106) to form a 3D stack arrangement. A 3D stack arrangement refers to a vertical stacking of IC devices. In contrast to placing IC devices on a board side by side horizontally, stacking IC devices vertically allows for IC devices to occupy less space and have greater connectively with other IC devices and components. As explained above, in a 3D electronic package, IC devices may be interconnected in a number of ways including with bond pads and micro-bumps, as shown in FIG. 1A, or with bonding pads, as shown in FIG. 2. TSVs are used for through chip connections. A TSV is a vertical electrical connection (via) passing completely through a silicon wafer or IC die. One of the reasons that TSVs are used to create 3D packages and 3D ICs, compared to alternatives such as package-on-package, is because the density of the vias is substantially higher, and because the length of the connections is shorter. In the example of FIG. 1C, each of the IC devices includes TSVs (156) that are used to electrically connect to another IC device through the bonding layer (106).

In the example of FIG. 1C, the first bonding layer (106) couples one side (140) of the first IC device (102) entirely to a portion (first portion 130) of a side of the second IC device (104). As shown in FIG. 1C, the remaining portion (second portion 132) of the side of the second IC device (104) that is not coupled to the one side of the first IC device, includes the antenna (120). That is, IC devices bonded together according to this 3D arrangement, are stacked such that the antenna of an IC device is exposed and is not covered up by the bonding layer or substrate of another IC device. Said another way, according to various embodiments, a gap (199) is created between IC devices such that an antenna from one IC device can be exposed. Creating a gap for the antenna will enable the IC device to be closely coupled to another IC device in a 3D stack, thus providing the density advances of 3D packaging. This gap for the antenna prevents attenuation of the RF signal in the substrate (158). Furthermore, in contrast to covering an antenna in substrate or other material, creating a gap for an antenna allows better signal reception and transmission. As will be explained in greater detail below, according to various embodiments, IC devices may be positioned and bonded together, creating a gap between IC devices for an antenna such that the antenna may be exposed on either the face or the back of an IC device. The gap (199) is shown open to ambient, i.e. air, but it could be sealed with a low RF loss passivant, such as a dielectric or polymer, that allows the RF signals to propagate from the antenna to the adjacent chip or device. FIGS. 1A-1C show a solder bump (150) to metal landing pad (152) connection while FIG. 2 shows a copper pillar (172) to metal pad (152) connection.

For further explanation, FIG. 2 sets forth a diagram illustrating a cross sectional view of various levels of another example electronic package (200) that includes a plurality of IC devices bonded in a 3D stack arrangement according to embodiments described herein. The electronic package (200) of FIG. 2 is similar to the electronic package (100) of FIG. 1 in that the electronic package (200) of FIG. 2 also includes the first IC device (102) and the second IC device (104) coupled together by the first bonding layer (106).

In the example of FIG. 2, however, the first IC device (102) includes Cu pillars (172) instead of C4 connections (150) for bonding with the second IC device (104). In this example, each of the IC devices includes the Cu pillars (172) for bonding with another IC device, a metal-to-metal bonding, or metal joining material, in the first bonding layer for coupling the first IC device to the second IC device. Regardless of the type of connection between the two IC devices (102, 104), according to various embodiments, the antenna (120) is still exposed in a gap between the two IC devices (102, 104).

Figure 3:
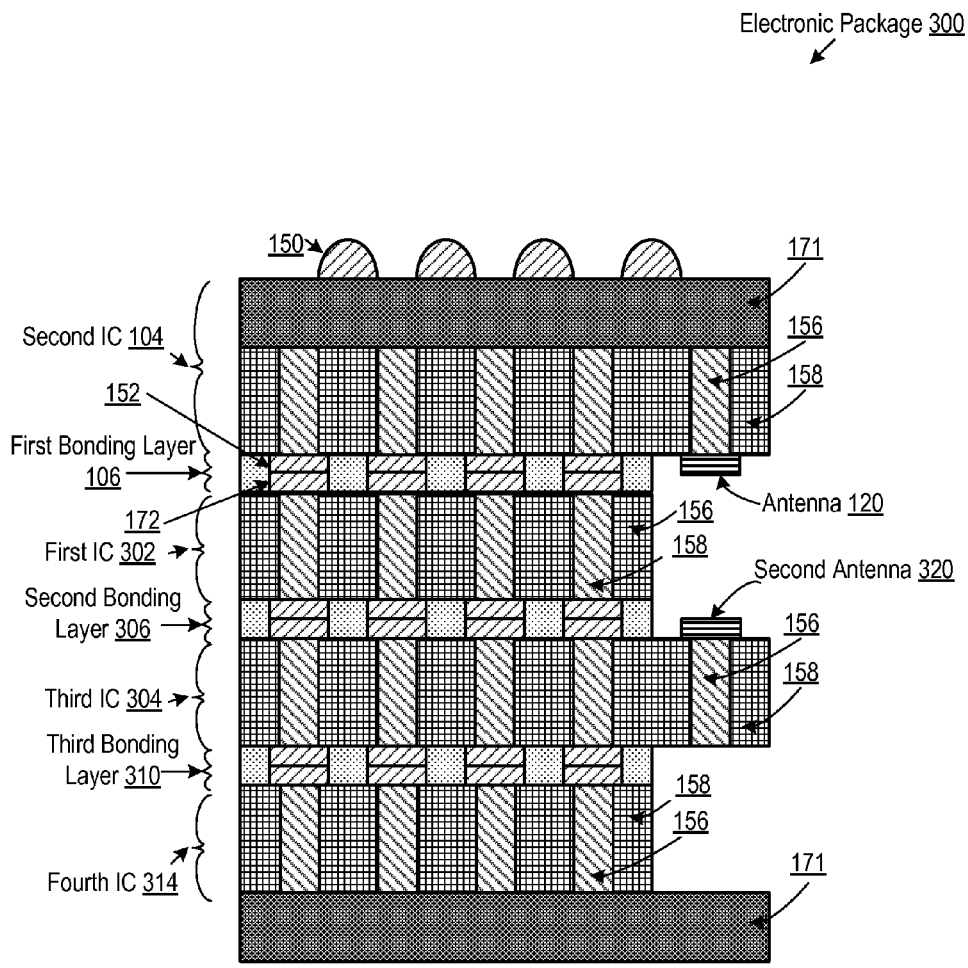
FIG. 3 sets forth a diagram illustrating a cross sectional view of various levels of another example electronic package that includes a plurality of IC devices bonded in a 3D stack arrangement according to embodiments described herein.

For further explanation, FIG. 3 sets forth a diagram illustrating a cross sectional view of various levels of another example electronic package (300) that includes a plurality of IC devices bonded in a 3D stack arrangement according to embodiments described herein. The electronic package (300) of FIG. 3 is similar to the electronic package (200) of FIG. 2 in that the electronic package (300) of FIG. 3 also includes a first IC device (302) and the second IC device (104) coupled together by the first bonding layer (106).

In the example of FIG. 3, however, the first IC device (302) is different from the first IC device (102) of FIG. 1 in that the first IC device (302) of FIG. 3 has a removed BEOL region, such that the TSVs (156) of the first IC device (102) are coupled on each side by the external connector Cu pillars (172) for bonding with other IC devices. In addition, the electronic package (300) also includes a third IC device (304) and a fourth IC device (314) coupled together by a third bonding layer (310). Readers of skill in the art will recognize that any number of IC devices may be utilized according to embodiments of this disclosure and that the four IC devices of FIG. 3 were selected for illustration and not limitation. In other embodiments, not illustrated, additional IC devices may be stacked in accordance with the other examples provided herein. In this example, the third IC device (304) is also coupled to the first IC device (302) with a second bonding layer (306) which couples another side of the first IC device (302) entirely to a portion of a side of the third IC device (304). The remaining portion of the side of the third IC device (304) that is not coupled to the other side of the first IC device (302), includes a second antenna (320). In the example of FIG. 3, the first antenna (120) of the second IC device (104) is on the face of the remaining portion (132) of the side of the second ID device and the second antenna (320) is on a back of the remaining portion (i.e., portion not connected to the first IC device) of the side of the third IC device (304).

Figure 4:
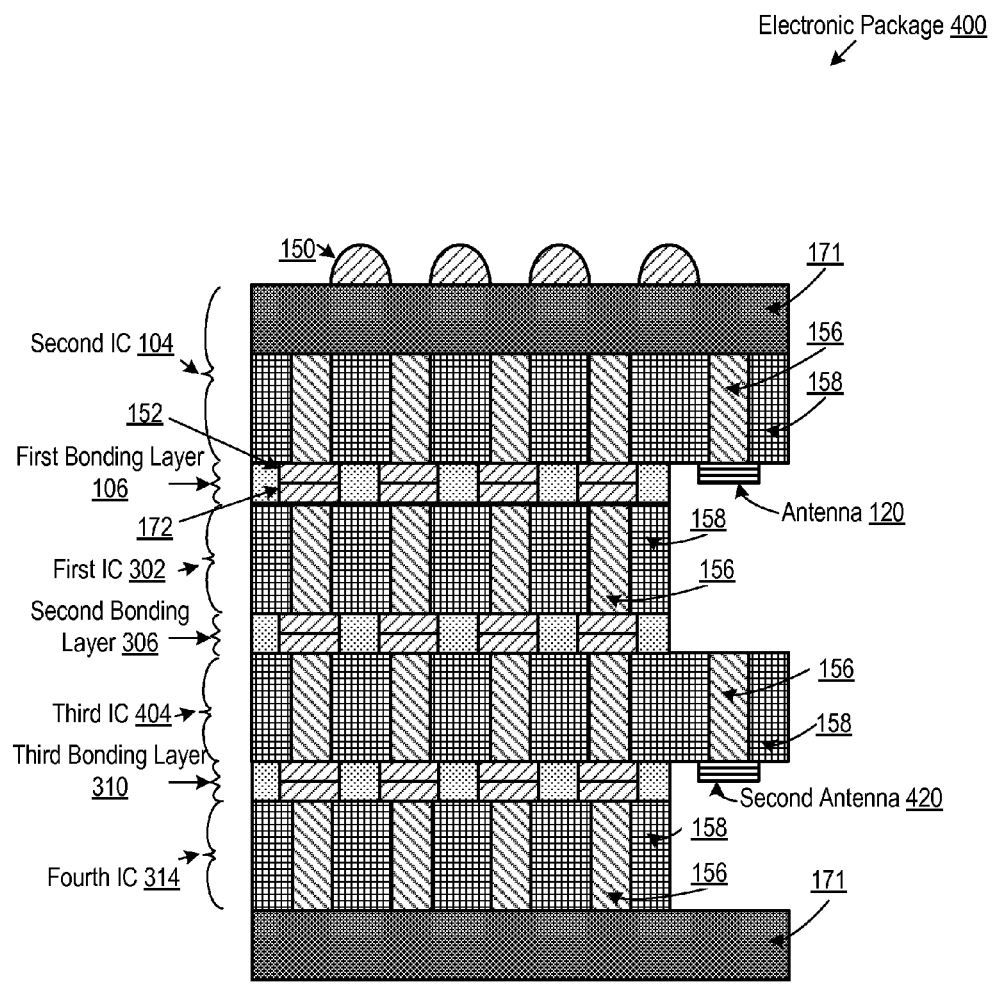
FIG. 4 sets forth a diagram illustrating a cross sectional view of various levels of another example electronic package that includes a plurality of IC devices bonded in a 3D stack arrangement according to embodiments described herein.

For further explanation, FIG. 4 sets forth a diagram illustrating a cross sectional view of various levels of another example electronic package that includes a plurality of IC devices bonded in a 3D stack arrangement according to embodiments described herein. The electronic package (400) of FIG. 4 is similar to the electronic package (300) of FIG. 3 in that the electronic package (400) of FIG. 4 also includes the first IC device (302) and the second IC device (104) coupled together by the first bonding layer (106); a third IC device (404) and the fourth IC device (314) coupled together by the third bonding layer (310); and the second bonding layer (306) coupling together the third IC device (404) to the first IC device (302).

In the example of FIG. 4, however, the third IC device (404) is different from the third IC device (304) of FIG. 3 in that the third IC device (404) of FIG. 4 has a second antenna (420) on the face of the remaining portion of the side of the third IC device (404). That is, in the example of FIG. 4, the first antenna (120) of the second IC device (104) is on the face of the remaining portion of the side of the second ID device and the second antenna (420) is on the face of the remaining portion of the side of the third IC device (404) that is not covered by the third bonding layer (310).

Figure 5:
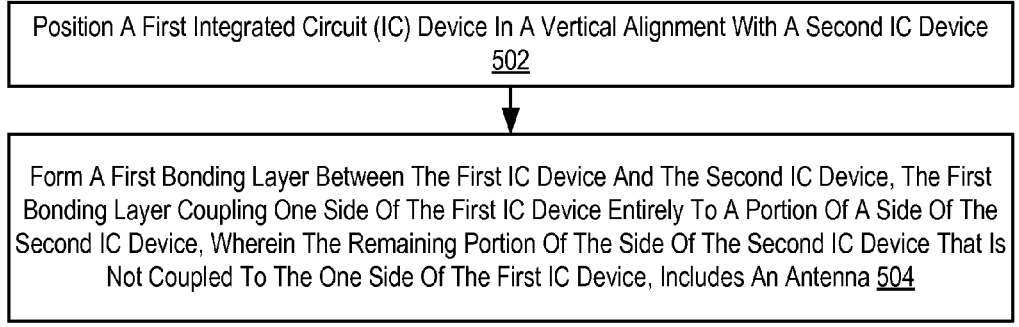
FIG. 5 sets forth a flow chart illustrating an exemplary method of creating an electronic package that includes a plurality of IC devices bonded in a 3D stack arrangement according to embodiments described herein.

For further explanation, FIG. 5 sets forth a flow chart illustrating an exemplary method of creating an electronic package that includes a plurality of IC devices bonded in a 3D stack arrangement according to embodiments described herein. The method of FIG. 5 includes positioning (502) a first IC device in a vertical alignment with a second IC device. Positioning (502) a first IC device in a vertical alignment with a second IC device may be carried out by identifying an IC device that includes an antenna; identifying another IC device that is smaller than the IC device with the antenna; aligning the two IC devices vertically such that the portion of the IC device that includes the antenna overhangs or is not covered by the other IC device without the antenna or the bonding layer coupling the two IC devices. That is, positioning the two IC devices includes creating a gap between the two IC devices such that the antenna is not blocked by bonding, substrate, or any other component or IC device by the vertical stacking of IC devices in the 3D electronic package.

The method of FIG. 5 also includes forming (504) a first bonding layer between the first IC device and the second IC device. Forming (504) a first bonding layer between the first IC device and the second IC device may be carried out by applying a joining metal material that bonds the substrate or metal components of the two IC devices together; applying solder connections between the two IC components; connecting one or more TSVs between the two IC devices. As described above with the positioning of the IC devices, according to embodiments, the bonding layer also is applied such that the bonding layer does not cover or obstruct the antenna. For example, according to various embodiments, the bonding layer couples one side of the first IC device entirely to a portion of a side of the second IC device, where the remaining portion of the side of the second IC device that is not coupled to the one side of the first IC device, includes an antenna.

Figure 6:
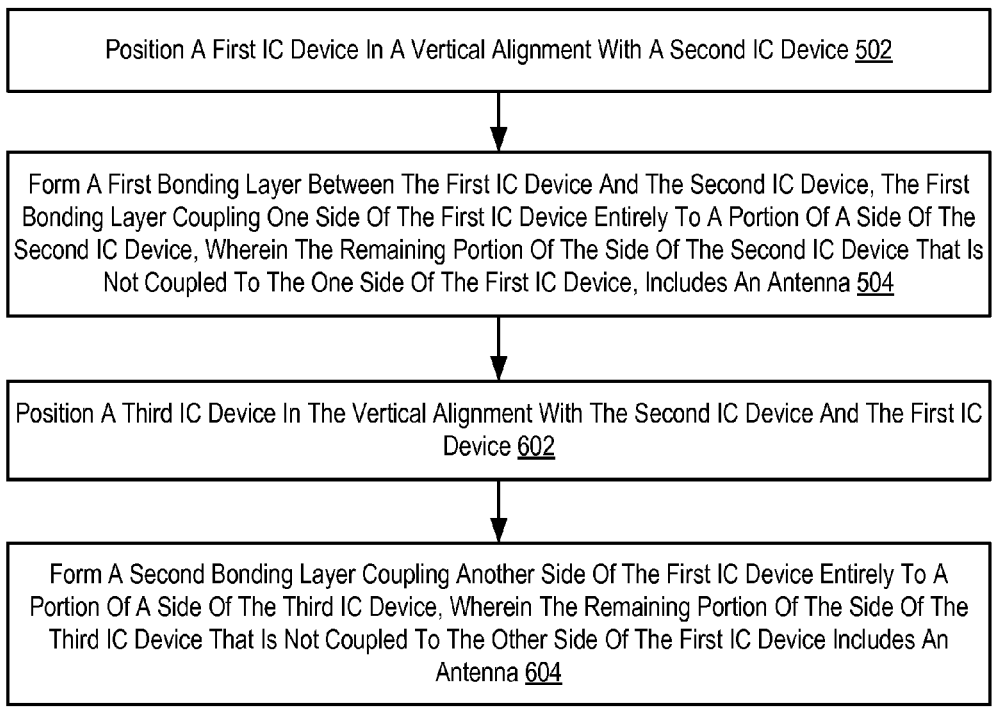
FIG. 6 sets forth a flow chart illustrating a further exemplary method of creating an electronic package that includes a plurality of IC devices bonded in a 3D stack arrangement according to embodiments described herein.

For further explanation, FIG. 6 sets forth a flow chart illustrating a further exemplary method of creating an electronic package that includes a plurality of IC devices bonded in a 3D stack arrangement according to embodiments described herein. The method of FIG. 6 is similar to the method of FIG. 5 in that the method of FIG. 6 also includes positioning (502) a first IC device in a vertical alignment with a second IC device; and forming (504) a first bonding layer between the first IC device and the second IC device.

The method of FIG. 6, however, also includes positioning (602) the third IC device in the vertical alignment with the second IC device and the first IC device. Positioning (602) the third IC device in the vertical alignment with the second IC device and the first IC device may be carried out by identifying an IC device that includes an antenna; identifying another IC device that is smaller than the IC device with the antenna; aligning the two IC devices vertically such that the portion of the IC device that includes the antenna overhangs or is not covered by the other IC device without the antenna or the bonding layer coupling the two IC devices. That is, positioning the two IC devices includes creating a gap between the two IC devices such that the antenna is not blocked by bonding, substrate, or any other component or IC device by the vertical stacking of IC devices in the 3D electronic package.

The method of FIG. 6 also includes forming (604) a second bonding layer coupling another side of the first IC device entirely to a portion of a side of the third IC device, wherein the remaining portion of the side of the third IC device that is not coupled to the other side of the first IC device, includes an antenna. Forming (604) a second bonding layer coupling another side of the first IC device entirely to a portion of a side of the third IC device may be carried out by applying a joining metal material that bonds the substrate or metal components of the two IC devices together; applying solder connections between the two IC components; connecting one or more TSVs between the two IC devices. As described above with the positioning of the IC devices, according to embodiments, the bonding layer also is applied such that the bonding layer does not cover or obstruct the antenna. For example, according to various embodiments, the bonding layer couples one side of the first IC device entirely to a portion of a side of the second IC device, where the remaining portion of the side of the second IC device that is not coupled to the one side of the first IC device, includes an antenna.

In view of the explanations set forth above, readers will recognize that the benefits of an electronic package that includes a plurality of vertically stacked IC devices bonded in a three-dimensional (3D) stack arrangement according to embodiments described herein include creating a gap for the antenna thus enabling the IC device with an antenna to be closely coupled to another IC device in a 3D stack, which provides the density advantages of 3D packaging. Furthermore, in contrast to covering an antenna is substrate or other material, creating a gap for an antenna allows better signal reception and transmission.

While the disclosure has been described with reference to a particular embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to any particular embodiment, but that the disclosure will include all embodiments falling within the scope of the appended claims. The scope of the present disclosure is therefore only limited by the language of the following claims.

What is claimed is:

1. An electronic package comprising:
   a plurality of vertically stacked integrated circuit (IC) devices including a first IC device and a second IC device; and
   a first bonding layer coupling one side of the first IC device entirely to a portion of a side of the second IC device; wherein the remaining portion of the side of the second IC device that is not coupled to the one side of the first IC device, includes an antenna.

2. The electronic package of claim 1 wherein the first IC device includes at least one semiconductor device and the second IC device includes at least one semiconductor device; wherein the at least one semiconductor device of the first IC device and the at least one semiconductor device of the second IC device are coupled together with a vertical insulated through substrate via.

3. The electronic package of claim 1 wherein the first bonding layer includes a metal joining material directly coupling the first IC device to the second IC device.

4. The electronic package of claim 1 wherein the first bonding layer includes one or more of a controlled collapse IC device connects (C4) bonding, copper pillar, or metal landing pad coupling the first IC device to the second IC device.

5. The electronic package of claim 1 wherein the antenna is formed on the second IC device using components fabricated in the back end of line (BEOL) portion of the IC device formation.

6. The electronic package of claim 1 wherein the antenna is formed on the second IC device using an insulated through substrate via (TSV).

7. The electronic package of claim 1 wherein the plurality of vertically stacked IC devices further comprises a third IC device; and wherein the electronic package further comprises a second bonding layer coupling another side of the first IC device entirely to a portion of a side of the third IC device; wherein the remaining portion of the side of the third IC device that is not coupled to the other side of the first IC device, includes an antenna.

8. The electronic package of claim 7 wherein the antenna of the second IC device is on a face of the remaining portion of the side of the second IC devices; and wherein the antenna of the third side is on a back of the remaining portion of the side of the third IC device.

9. The electronic package of claim 7 wherein the antenna of the second IC device is on a face of the remaining portion of the side of the second IC device; and wherein the antenna of the third IC device is on a face of the remaining portion of the side of the third IC device.

10. A method of creating an electronic package that includes a plurality of vertically stacked integrated circuit (IC) devices, the method comprising:

positioning a first IC device in a vertical alignment with a second IC device; and forming a first bonding layer between the first IC device and the second IC device; the first bonding layer coupling one side of the first IC device entirely to a portion of a side of the second IC device; wherein the remaining portion of the side of the second IC device that is not coupled to the one side of the first IC device, includes an antenna.

11. The method of claim 10 wherein the first IC device includes at least one semiconductor device and the second IC device includes at least one semiconductor device; and wherein the at least one semiconductor device of the first IC device and the at least one semiconductor device of the second IC device are coupled together with a vertical insulated through substrate via (TSV).

12. The method of claim 10 wherein the first bonding layer includes a metal joining material directly coupling the first IC device to the second IC device.

13. The method of claim 10 wherein the first bonding layer includes one or more of a controlled collapse IC device connects (C4) bonding, copper pillar, or metal landing pad coupling the first IC device to the second IC device.

14. The method of claim 10 wherein the antenna is formed on the second IC device using components fabricated in the back end of line (BEOL) portion of the IC device formation.

15. The method of claim 10 wherein the antenna is formed on the second IC device using an insulated through substrate via (TSV).

16. The method of claim 10 wherein the electronic package further comprises a third IC device; wherein the method further comprises:

positioning the third IC device in the vertical alignment with the second IC device and the first IC device; and forming a second bonding layer coupling another side of the first IC device entirely to a portion of a side of the third IC device, wherein the remaining portion of the side of the third IC device that is not coupled to the other side of the first IC device, includes an antenna.

17. The method of claim 10 wherein the antenna of the second IC device is on a face of the remaining portion of the side of the second IC device; and wherein the antenna of the third IC device is on a back of the remaining portion of the side of the third IC device.

18. The method of claim 17 wherein the antenna of the second IC device is on a face of the remaining portion of the side of the second IC device; and wherein the antenna of the third side is on a face of the remaining portion of the side of the third IC device.

* * * * *